(12) United States Patent
Borland et al.

(10) Patent No.: US 7,100,277 B2
(45) Date of Patent: Sep. 5, 2006

(54) METHODS OF FORMING PRINTED CIRCUIT BOARDS HAVING EMBEDDED THICK FILM CAPACITORS

(75) Inventors: William J. Borland, Cary, NC (US); Saul Ferguson, Durham, NC (US); Hena Pyada, Dorado, PR (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/882,820

(22) Filed: Jul. 1, 2004

(65) Prior Publication Data

US 2006/0002097 A1    Jan. 5, 2006

(51) Int. Cl.
 *H05K 3/30* (2006.01)
 *H05K 7/12* (2006.01)

(52) U.S. Cl. ............ 29/832; 29/825; 29/846; 29/852; 29/25.03; 361/763

(58) Field of Classification Search .......... 29/29, 29/610.1, 620, 621, 825–832, 855, 25.03; 174/254, 262, 264, 35 R; 427/79, 80; 361/301.3, 361/306.3
See application file for complete search history.

(56) References Cited

U.S. PATENT DOCUMENTS

| | | | |
|---|---|---|---|
| 4,190,854 A | | 2/1980 | Redfern |
| 4,572,843 A | * | 2/1986 | Saito et al. ............ 427/554 |
| 5,736,681 A | * | 4/1998 | Yamamoto et al. ......... 174/265 |
| 6,317,023 B1 | | 11/2001 | Felten |
| 6,631,551 B1 | | 10/2003 | Bowles et al. |
| 6,860,000 B1 | * | 3/2005 | Felten ............ 29/610.1 |
| 6,872,893 B1 | * | 3/2005 | Fukuoka et al. ........... 174/255 |
| 6,910,266 B1 | * | 6/2005 | Lee et al. ............ 29/832 |
| 2002/0179329 A1 | | 12/2002 | Fukuoka et al. |
| 2003/0154592 A1 | | 8/2003 | Felten |

FOREIGN PATENT DOCUMENTS

| | | |
|---|---|---|
| JP | 2-153589 | 6/1990 |
| JP | 2001-168491 | 12/1999 |
| JP | 2003-92460 | 5/2002 |

OTHER PUBLICATIONS

John Felten and Saul Ferguson, Embedded Ceramic Resistors and Capacitors for PWB, IP Printed Circuit Expo, San Diego, CA, Apr. 2000.
John J. Felten and Saul Ferguson, Ceramic Resistors and Capacitors Embedded in PWB, IPC, San Diego, Apr. 5, 2000.
John J. Felten and Saul Ferguson, Ceramic Resistors and Capacitors Embedeed in PWB, IMAPS, Denver, Apr. 29, 2000.
John J. Felten and William J. Borland, Embedded Ceramic Passives in PWB: Process Development, IPC Printed Circuit Expo, Anaheim, CA, Apr. 2001.
John J. Felten and William J. Borland, Ceramic Resistors and Capacitors Embedded in PWB's, IPC Expo, Apr. 3, 2001.
William Borland, Designing for Embedded Passives, Printed Circuit Design, Aug. 2001.
William Borland, John J. Felten, Thick Film Ceramic Capacitors and Resistors inside Printed Circuit Boards, 34th International Symposium on Microelectronics (IMAPS), Oct. 9-11th, 2001, Baltimore, MD.

(Continued)

*Primary Examiner*—Minh Trinh

(57) ABSTRACT

A method of forming printed wiring boards having embedded thick-film capacitors includes covering capacitor layers with a protective coating prior to etching to prevent etching solutions from contacting with and damaging the capacitor layers and forming vias directly between the capacitor electrodes and the board circuitry.

10 Claims, 7 Drawing Sheets

OTHER PUBLICATIONS

John Felten, Richard Snogren, Jiming Zhou, Embedded Ceramic Resistors and Capacitors in PWB: Process and Performance, Fall IPC Meeting, Oct. 11, 2001, Orlando, FL.

William J. Borland and Saul Ferguson, Embedded Passive Components In Printed Wiring Boards, a Technology Review, To be published in CircuiTree Magazine, 2001.

Jiming Zhou, John D. Myers and John J. Felten, Embedded Passives Technology for PCBs: Materials, Design, and Process, IMAPS 2002 Conference, Denver, CO, Sep. 4-6, 2002.

John J. Felten, Electronic Circuits World Convention, Paper No. IPC31, Advanced Embedded Passives Technologies—Putting Ceramic Components into Organic PWBs.

William Borland, John J. Felten, Saul Ferguson, Alton B. Jones and Angela A. Lawrence, Embedded Singulated Ceramic Passives in Printed Wiring Boards, IMAPS Advanced Technology Workshop on Passive Integration, Ogunquit, ME, Jun. 19-21, 2002.

Dr. Kim Fjeldsted and Stacey L. Chase, Embedded Passives: Laser Trimmed Resistors, Circuitree, vol. 70, Mar. 2002.

* cited by examiner

METHODS OF FORMING PRINTED CIRCUIT BOARDS HAVING EMBEDDED THICK FILM CAPACITORS

BACKGROUND

1. Technical Field

The technical field is thick film capacitors, in general. More particularly, embedded capacitors in printed circuit boards. Still more particularly, the technical field includes embedded capacitors in printed circuit boards made from thick film dielectrics.

2. Related Art

The practice of embedding capacitors in printed circuit boards (PCB) allows for reduced circuit size and improved circuit performance. Capacitors are typically embedded in panels that are stacked and connected by interconnection circuitry, the stack of panels forming a printed circuit board. The stacked panels can be generally referred to as "innerlayer panels."

Passive circuit components embedded in printed circuit boards formed by fired-on-foil technology are known. "Separately fired-on-foil" capacitors are formed by depositing a thick-film capacitor material layer onto a metallic foil substrate, followed by depositing a top electrode material over the thick-film capacitor material layer and a subsequent firing under copper thick-film firing conditions. The thick-film capacitor material may include high dielectric constant materials, glasses and/or dopants, and should have a high dielectric constant (K) after firing.

After firing, the resulting article may be laminated to a prepreg dielectric layer and the metallic foil may be etched to form the electrodes of the capacitor and any associated circuitry. However, etching solutions common in the printed circuit board industry, such as ferric chloride in hot 2.4 normal hydrochloric acid, may attack and dissolve the capacitor dielectric glass and dopants. Etching solutions damage capacitor dielectrics such that many capacitors may be shorted after etching. Even when shorting has not occurred, the damage to the dielectric may compromise the long term reliability of the capacitor, especially if all of the etching solution has not been thoroughly removed from the capacitor. Other solutions commonly used in the printed circuit board industry for other processes, such as the black oxide process and plating, may also damage capacitor dielectrics and have similar long-term reliability implications.

One solution to the etching problem is to use a high silica content glass in the thick-film capacitor composition that is resistant to etching solutions. High silica glasses, however, have very low dielectric constants and high softening points. When used in capacitor formulations, the high softening points make the resulting compositions difficult to sinter to high density unless large volume fractions of glass are present. High volume fractions of glass however, result in undesirable low dielectric constants for the resulting dielectric.

The present inventors desired to provide a solution to this etching problem by creating novel methods of making capacitors and printed circuit boards. The inventors have accomplished such a goal by developing novel methods which incorporate the use of a protective coating.

SUMMARY

According to a first embodiment, a method of making a capacitor comprises: providing a metallic foil; forming a dielectric over the metallic foil; forming a first electrode over a portion of the dielectric; forming a protective coating over a portion of the metallic foil, including the entire dielectric; and etching the metallic foil to form a second electrode.

According to another embodiment, a capacitor comprises: a first electrode formed from a metallic foil; a dielectric adjacent to the first electrode; a second electrode adjacent to the dielectric; and a protective coating disposed over and contacting at least a part of the dielectric and at least part of the metallic foil.

According to a further embodiment, a method of making a printed circuit board comprises forming a dielectric over a metallic foil, forming a first electrode over the dielectric, laminating a non-component side of the metallic foil to at least one dielectric material, forming a protective coating over at least a part of the dielectric, and etching the metallic foil to form a second electrode.

The protective coating can be formed from a photoresist, which is removed after the etching process. In alternative embodiments, protective coatings are formed from alternative materials which remain in finished printed circuit boards.

According to the above embodiments, a protective coating protects all or a part of a dielectric of a capacitor from etching solutions used during fabrication. The etching solutions would otherwise attack and dissolve the dielectric glasses and dopants present in the dielectric. Capacitor reliability and performance are thereby improved, and shorts of the capacitor are avoided. Also, etch resistant glasses, which reduce the resultant dielectric constant of the dielectric, are not required in the fabrication processes according to the present embodiments.

Those skilled in the art will appreciate the above stated advantages and other advantages and benefits of various additional embodiments of the invention upon reading the following detailed description of the embodiments.

BRIEF DESCRIPTION OF THE DRAWINGS

The detailed description will refer to the following drawings wherein.

According to common practice, the various features of the drawings are not necessarily drawn to scale. Dimensions of various features may be expanded or reduced to more clearly illustrate the embodiments of the invention.

DETAILED DESCRIPTION

Figure 1A:
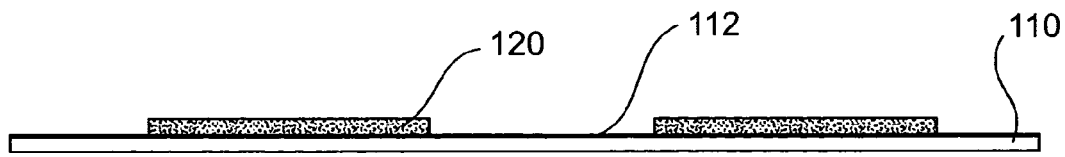
FIGS. 1A–1J are a series of views illustrating a first method of manufacturing a multilayer printed circuit board with embedded capacitors having a single-layer capacitor on metallic foil design.
Figure 1B:
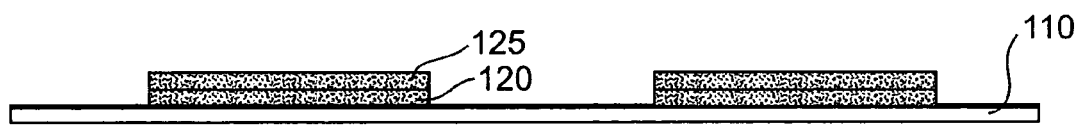
Figure 1C:
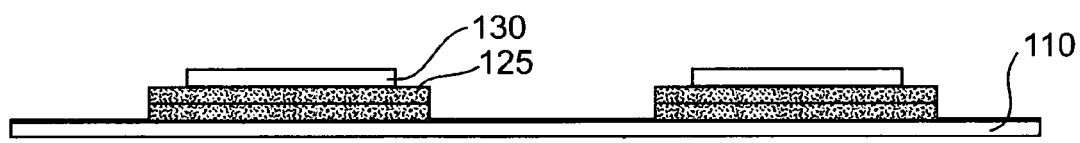
Figure 1D:
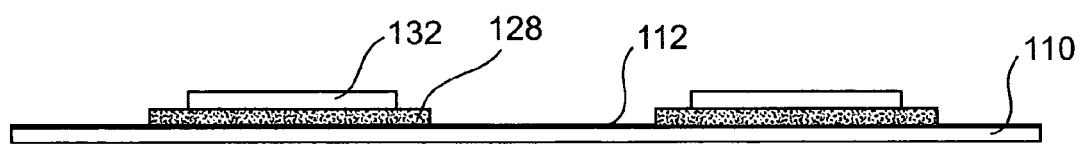
Figure 1E:
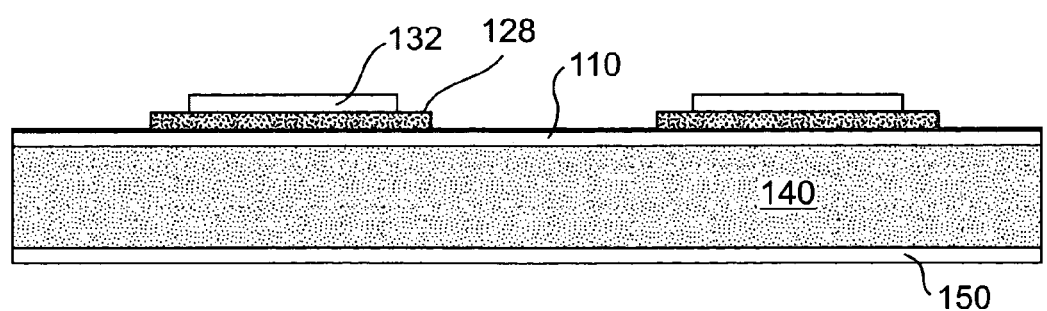
Figure 1F:
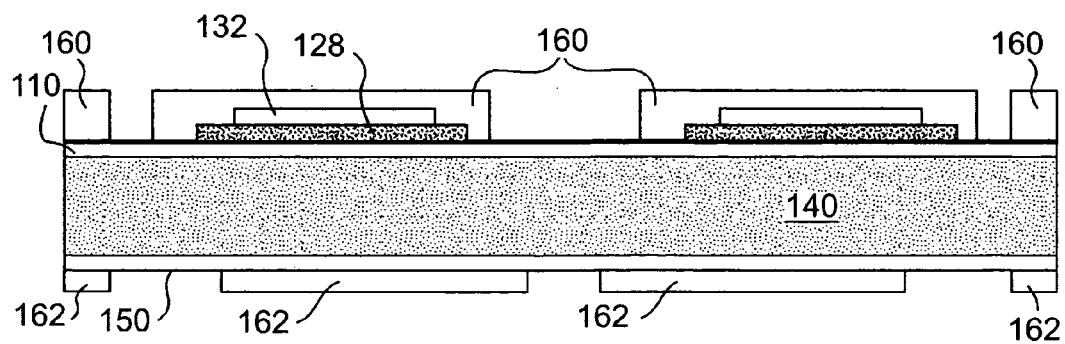
Figure 1G:
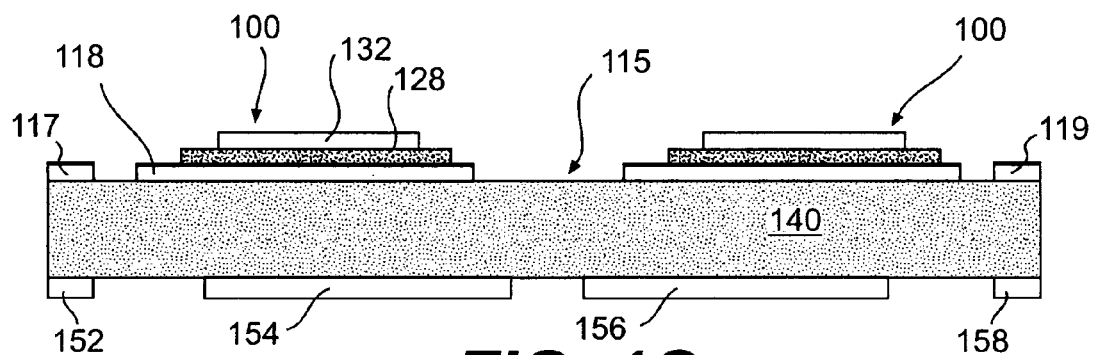
Figure 1H:
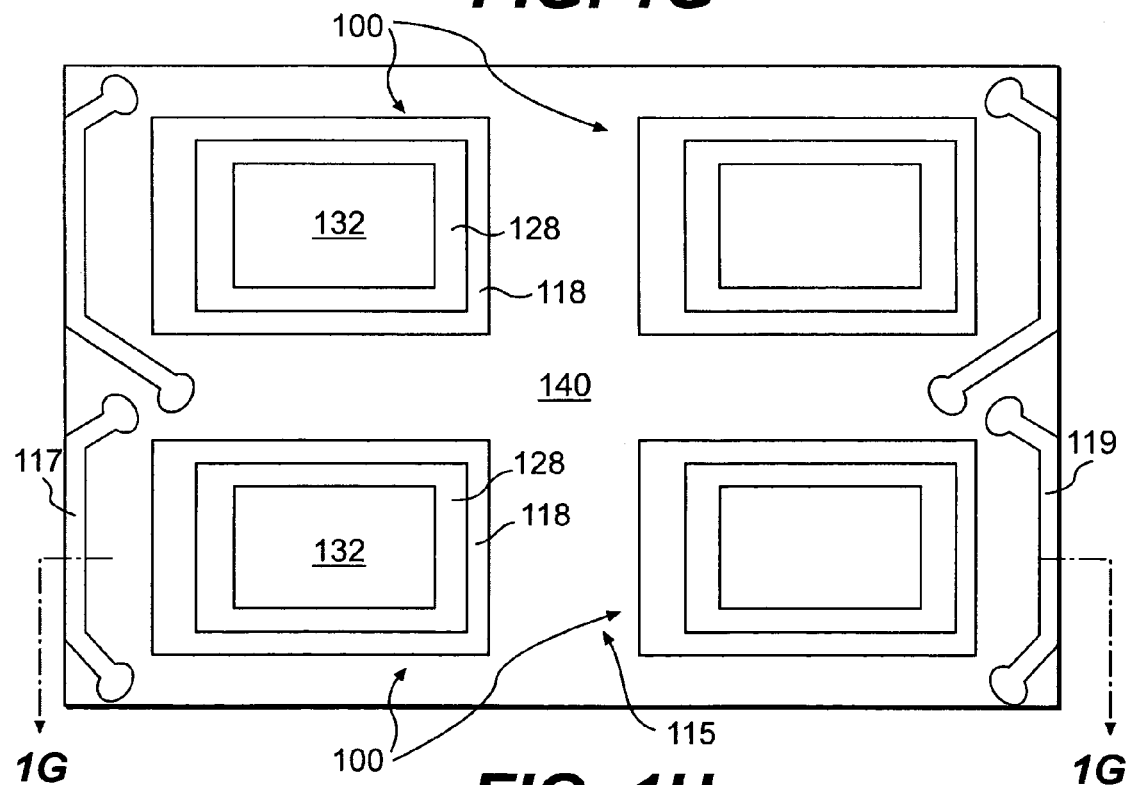

FIGS. 1A–1J illustrate a first method of manufacturing a multilayer printed circuit board (PCB) 1000 (FIG. 1J) with embedded capacitors having a single-layer capacitor on metallic foil design. For illustrative purposes, four embedded capacitors are illustrated as formed in FIGS. 1A–1J (only two capacitors are visible in the sectional views FIGS. 1A–1G and 1I–1J). However, one, two, three, or more capacitors can be formed on a foil by the methods described in this specification. The following written description is addressed to the formation of only one of the illustrated capacitors for the sake of simplicity. FIGS. 1A–1G and 1I–1J are sectional views in front elevation. FIG. 1G is a cross section taken on line 1G—1G in FIG. 1H. FIG. 1H is a top plan view showing four embedded capacitors 100.

In FIG. 1A, a metallic foil 110 is provided. The metallic foil 110 may be of a type generally available in the industry. For example, the metallic foil 110 may be copper, copper-invar-copper, invar, nickel, nickel-coated copper, or other metals and alloys that have melting points that exceed the firing temperature for thick film pastes. Suitable foils include foils comprised predominantly of copper, such as reverse treated copper foils, double-treated copper foils, and other copper foils commonly used in the multilayer printed circuit board industry. The thickness of the metallic foil 110 may be in the range of, for example, about 1–100 microns. Other thickness ranges include 3–75 microns, and more specifically 12–36 microns. These thickness ranges correspond to between about ⅓ oz and 1 oz copper foil.

The foil 110 may be pretreated by applying an underprint 112 to the foil 110. The underprint 112 is shown as a surface coating in FIG. 1A, and may be a relatively thin layer applied to the component-side surface of the foil 110. The underprint 112 adheres well to the metal foil 110 and to layers deposited over the underprint 112. The underprint 112 may be formed, for example, from a paste applied to the foil 110 that is fired at a temperature below the melting point of the foil 110. The underprint paste may be printed as an open coating over the entire surface of the foil 110, or printed over selected areas of the foil 110. It is generally more economical to print the underprint paste over selected areas of the foil 110 rather than over the entire foil 110. However, it may be preferable to coat the entire surface of the foil 110 if oxygen-doped firing is used in conjunction with a copper foil 110, because glass content in the underprint retards oxidative corrosion of the copper foil 110.

One thick-film paste suitable for use as an underprint has the following composition (amounts relative by mass):

| | |
|---|---|
| Copper powder | 58.4 |
| Glass A | 1.7 |
| Cuprous oxide powder | 5.8 |
| Vehicle | 11.7 |
| TEXANOL ® solvent | 12.9 |
| Surfactant | 0.5 |
| Total | 91.0 |

In this composition,
Glass A comprises: lead germanate of the composition $Pb_5Ge_3O_{11}$
Vehicle comprises: Ethyl cellulose N200 11%
TEXANOL ® 89%
Surfactant comprises: VARIQUAT ® CC-9 NS surfactant
TEXANOL ® is available from Eastman Chemical Co.
VARIQUAT ® CC-9 NS is available from Ashland Inc.

A capacitor dielectric material is deposited over the underprint 112 of the pretreated foil 110, forming a first dielectric material layer 120 (FIG. 1A). The capacitor dielectric material may be, for example, a thick-film capacitor paste that is screen-printed onto the foil 110. The first dielectric material layer 120 is then dried. In FIG. 1B, a second dielectric material layer 125 is then applied, and dried. In an alternative embodiment, a single layer of capacitor dielectric material may be deposited to an equivalent thickness of the two layers 120, 125, in a single screen printing step. One suitable thick-film capacitor material disclosed for use in fired-on-foil embodiments has the following composition (amounts relative by mass):

| | |
|---|---|
| Barium titanate powder | 68.55 |
| Lithium fluoride | 1.0 |
| Barium fluoride | 1.36 |
| Zinc fluoride | 0.74 |
| Glass A | 10.25 |
| Glass B | 1.0 |
| Glass C | 1.0 |
| Vehicle | 5.9 |
| TEXANOL ® solvent | 8.7 |
| Oxidizer | 1.0 |
| Phosphate wetting agent | 0.5 |
| Total | 100.00 |

In this composition,
Glass A comprises: lead germanate of the composition $Pb_5Ge_3O_{11}$
Glass B comprises: $Pb_4BaGe_{1.5}Si_{1.5}O_{11}$
Glass C comprises: $Pb_5GeSiTiO_{11}$
Vehicle comprises: Ethyl cellulose N200 11%
TEXANOL ® solvent 89%
Oxidizer comprises: Barium nitrate powder 84%
Vehicle 16%

In FIG. 1C, a conductive material layer 130 is formed over the second dielectric material layer 125, and dried. The conductive material layer 130 can be formed by, for example, screen-printing a thick-film metallic paste over the second dielectric material layer 125. The paste used to form the underprint 112 is also suitable for forming the conductive material layer 130. In general, the surface area of the first and second dielectric layers 120, 125, when viewed from a top plan perspective, preferably is larger than that of the conductive material layer 130.

The first dielectric material layer 120, the second dielectric material layer 125, and the conductive material layer 130 are then co-fired to sinter the resulting structure together. The post-fired structure section is shown in front elevation in FIG. 1D. Firing results in a single dielectric 128 formed from the dielectric layers 120 and 125, because the boundary between the dielectric layers 120 and 125 is effectively removed during co-firing. A top electrode 132 also results from the co-firing step. When fired on copper foil in nitrogen at 900° C. for 10 minutes at peak temperature, the resulting dielectric 128 may have a dielectric constant of between about 3000 and 5000 and a dissipation factor of approximately 2.5%. Alternative firing conditions may be used to obtain differing material properties for the dielectric 128.

In FIG. 1E, the opposite surface of the foil 110 is laminated with laminate material 140 with the top electrode 132 face up. The resulting structure is an innerlayer panel. The lamination can be performed, for example, using FR4 prepreg in standard printing wiring board processes. In one embodiment, 106 epoxy prepreg may be used. Suitable lamination conditions, for example, are 185° C. at 208 psig for 1 hour in a vacuum chamber evacuated to 28 inches of mercury. A silicone rubber press pad and a smooth PTFE-filled glass release sheet may be in contact with the foil 110 to prevent the epoxy from gluing the lamination plates together. The laminate material 140 can be any type of dielectric material such as, for example, standard epoxy, high Tg epoxy, polyimide, polytetrafluoroethylene, cyanate ester resins, filled resin systems, BT epoxy, and other resins and laminates that provide insulation between circuit layers. A foil 150 may be applied to an opposite side of the laminate material 140 to provide a surface for creating circuitry.

Referring to FIG. 1F, after lamination, a protective coating 160 is applied over the dielectric 128 and the top electrode 132. A portion of the foil 110 may also be covered. The protective coating 160 serves to cover and protect all or a part of the dielectric 128 and the top electrode 132 during a subsequent etching process.

In the embodiment described herein, the protective coating 160 is formed by imaging and developing a photoresist that covers all of the dielectric 128 and the top electrode 132. This approach is particularly advantageous because the photoresist 160 can be used to form associated circuitry from the foil 110 as well as serving as the protective coating 160. A photoresist is also applied to the foil 150, imaged, and developed to form a photoresist pattern 162.

FIG. 1G is a sectional view taken on line 1G—1G in FIG. 1H. Referring to FIG. 1G, the foils 110 and 150 are etched, and the photoresists 160 and 162 are stripped using, for example, standard printing wiring board processing conditions. The etching forms a trench 115 in the foil 110, and results in a bottom or capacitor foil electrode 118 that is isolated from the remainder of the foil. The capacitor foil electrode 118, the dielectric 128, and the top electrode 132 form a capacitor 100. The etching process also creates circuitry 117, 119 from the foil 110 and circuitry 152, 154, 156, 158, etc. from the foil 150.

FIG. 1H is a top plan view of the article shown in FIG. 1G. In FIG. 1H, four capacitors 100 are shown as formed from a part of the foil 110. This number is exemplary, however, and any number of capacitors may be formed from a foil according to the embodiments discussed herein. FIG. 1H illustrates four capacitors 100 of similar configuration, however, the present embodiment allows for the formation of capacitors of differing dimensions and/or shape. The circuitry 117, 119 can serve as, for example, circuitry for a layer in the finished printed wiring board 1000 (FIG. 1J). Other circuitry having similar or differing configurations can also be formed from the foil 150. Additional circuit components such as resistors can also be formed as part of the same layer as the capacitors 100.

In the above embodiment, during the etching process, the etching solution does not come in contact with the capacitor dielectric material of the capacitor 100 because the photoresist protective coating 160 protects the capacitor 100. Reliability of the capacitor 100 is thereby increased. In addition, the possibility of shorting of the finished capacitor 100 is greatly reduced.

Figure 1I:
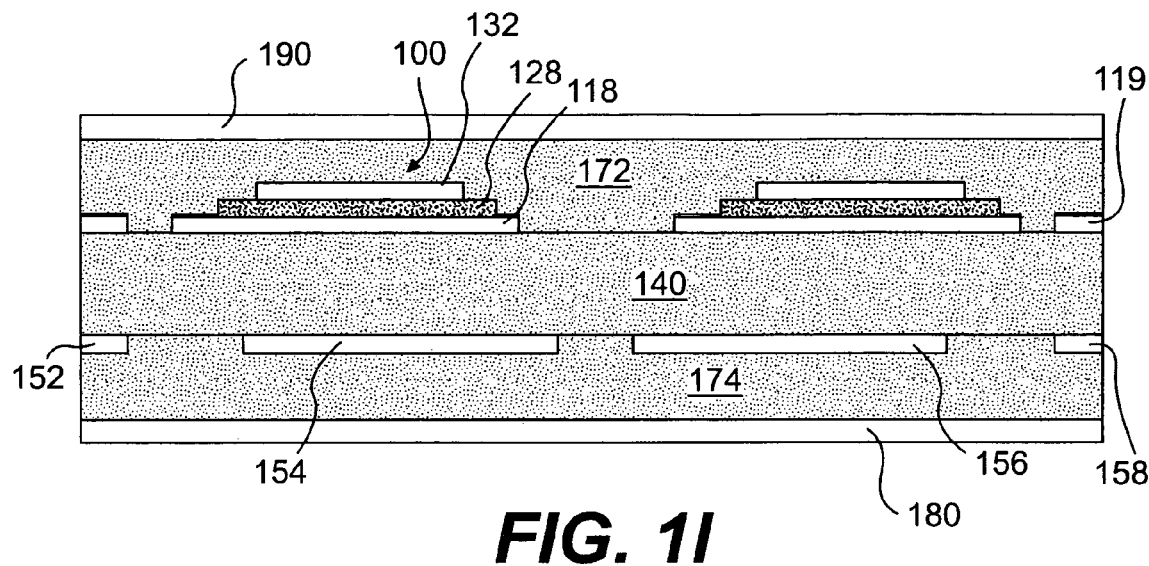
Figure 1J:
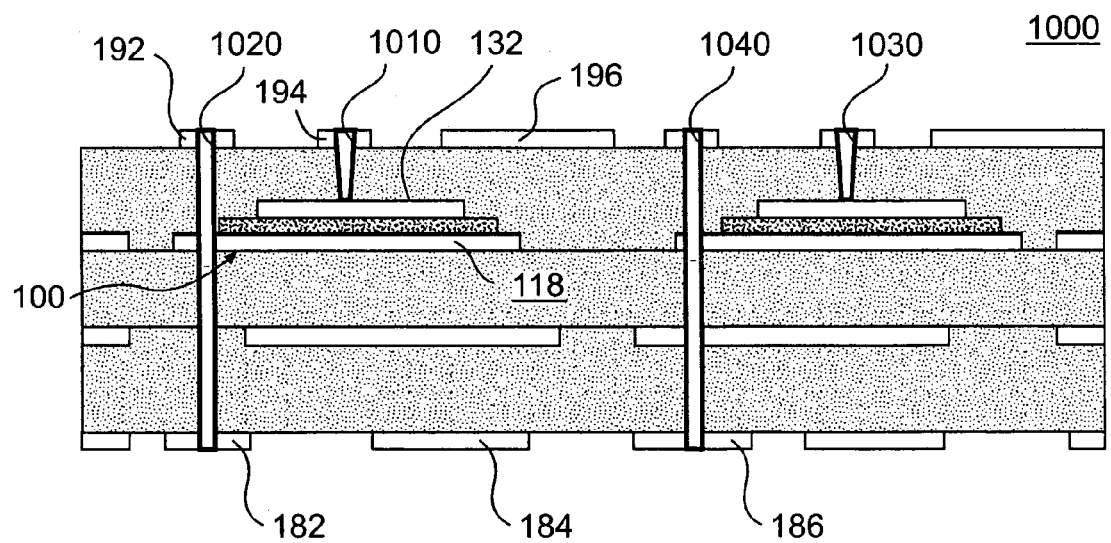

Referring to FIG. 1I, additional laminates 172, 174 and copper foil pairs 180, 190 may be laminated to both sides of the article shown in FIG. 1G.

FIG. 1J shows a completed printed circuit board 1000. Referring back to FIG. 1I, a photoresist (not shown) is applied to foils 180 and 190. The photoresist is imaged and developed and the foils 180, 190 are etched to form circuitry 182, 184, 186, etc. and 192, 194, 196, etc. on the outer layers of the printed circuit board 1000. A microvia 1010 may be laser drilled and plated to electrically connect the electrode 132 with the outer circuitry 194. A via 1020 may be drilled and plated to electrically connect the bottom or foil electrode 118 to the outer circuitry 182, 192 in order to complete the electrical connections of the capacitor 100. Additional vias 1030, 1040 may also be formed to electrically connect to the second capacitor 100 shown in FIG. 1J. Top surfaces of the printed circuit board 1000 may be plated with tarnish resistance metals, and finally the photoresists stripped to complete the printed circuit board 1000.

The finished circuit board 1000 in FIG. 1J is a four metal layer printed wiring board with the embedded capacitors 100 in the layer adjacent to the outer layer of the printed circuit board 1000. However, the printed wiring board 1000 may have any number of layers and the embedded capacitors according to the present embodiments can be located at any layer in a multilayer printed circuit board. Microvias may also be used to connect circuitry with the capacitor foil electrode 118, as an alternative to plated through-hole vias.

Figure 2A:
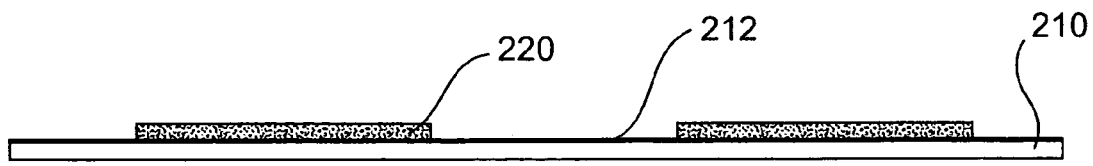
FIGS. 2A–2K are a series of views illustrating a method of manufacturing a printed circuit board with embedded capacitors having a double-layer capacitor on metallic foil design.
Figure 2B:
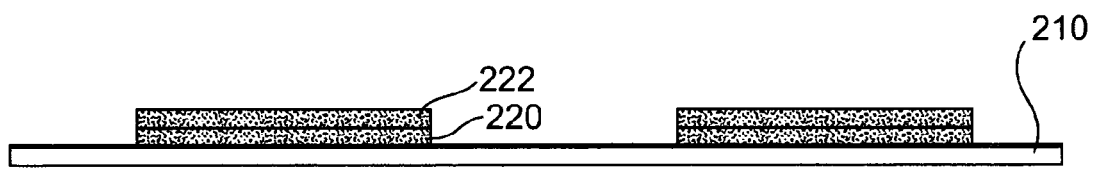
Figure 2C:
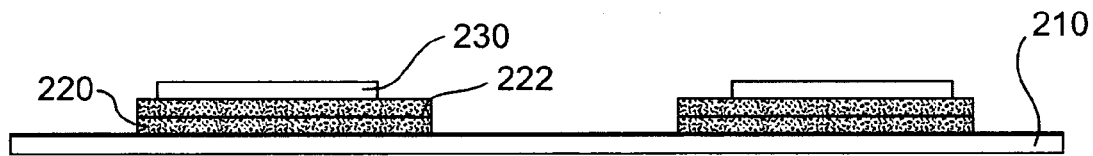
Figure 2D:
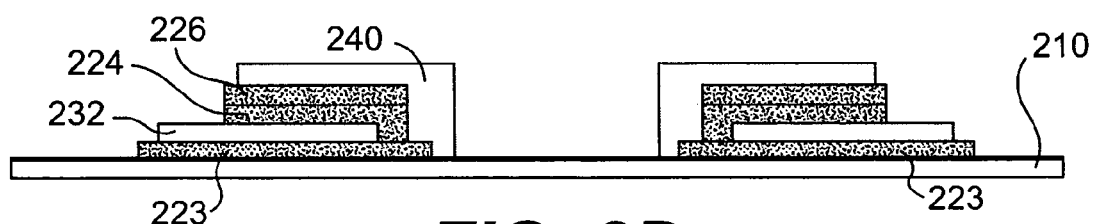
Figure 2E:
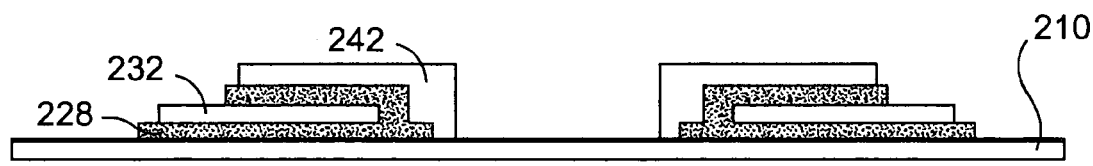
Figure 2F:
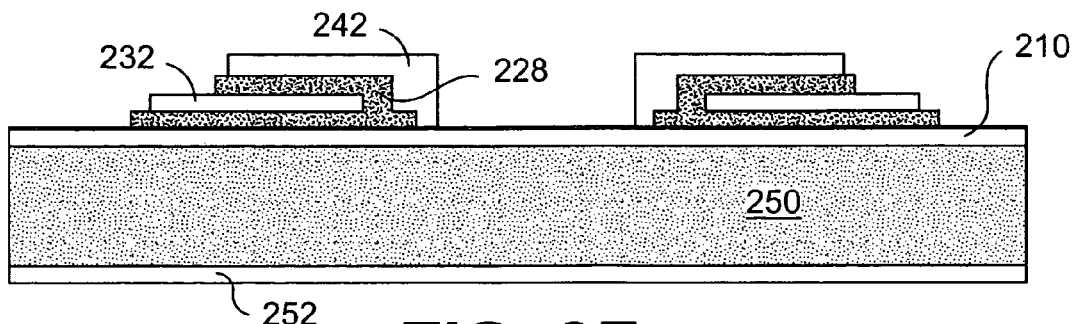
Figure 2G:
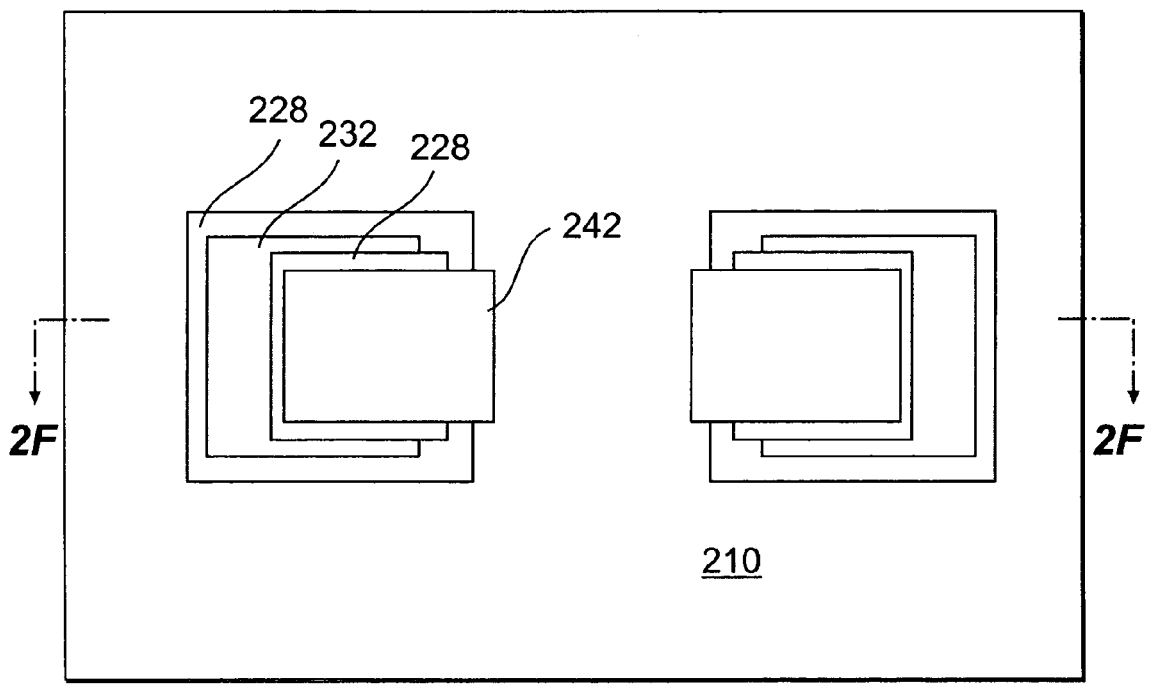

FIGS. 2A–2K illustrate a method of manufacturing a printed circuit board 2000 (FIG. 2K) with embedded capacitors 200 having two layers of dielectric and three electrodes. The description below discusses the formation of one capacitor 200 for simplicity. FIGS. 2A–2F and 2H–2K are sectional views in front elevation. FIG. 2F is taken on line 2F—2F in FIG. 2G. FIG. 2G is a top plan view showing two embedded capacitors 200.

In FIG. 2A, a metallic foil 210 is provided. The metallic foil 210 may be of a type generally available in the industry and may be constructed of similar materials to the foil 110 illustrated in FIG. 1A. The foil 210 may be pretreated by applying an underprint 212 to the foil 210 as an open coating over the entire surface of the foil 210, or printed over selected areas of the foil 210. A capacitor dielectric material is deposited over the underprint 212 of the pretreated foil 210, forming a first dielectric material layer 220. The first dielectric material layer 220 is then dried. In FIG. 2B, a second dielectric material layer 222 is applied, and dried. As stated, with respect to the embodiment of FIG. 1A, it is also possible to deposit one thick layer rather than two layers 220, 222.

In FIG. 2C, a first conductive material layer 230 is formed over the second dielectric material layer 222, and dried. The first dielectric material layer 220, the second dielectric material layer 222, and the first conductive material layer 230 are then co-fired to sinter the structure together. Firing results in a single dielectric 223 formed from the dielectric layers 220 and 222, and an electrode 232 (the resultant dielectric 223 and electrode 232 are shown in FIG. 2D).

Referring to FIG. 2D, a third dielectric material layer 224 is formed over the electrode 232, and dried. A fourth dielectric material layer 226 is formed over the third dielectric material layer 224, and dried, and a second conductive material layer 240 is formed over the fourth dielectric material layer 226, and dried. The resulting article is then fired. FIG. 2E shows the post-fired article. Firing results in a two-layer dielectric 228 formed from the dielectric layers 220, 222, 224, 226, and a top electrode 242 that is electrically isolated from the middle electrode 232 and electrically connected to the foil 210. As an alternative to the separate firing steps shown in FIGS. 2C–2E, a single firing step can be used to form the structure shown in FIG. 2E.

Referring to FIG. 2F, the opposite surface of the foil 210 is laminated with laminate material 250 with the top electrode 242 face up using similar materials and under similar conditions to the processes described above with reference to FIG. 1E. The foil 210 may be laminated such that the capacitor structures are on the outside of the innerlayer panel structure. A foil 252 may be applied to the laminate material 250 to provide a surface for creating circuitry. The resulting structure is an innerlayer panel.

FIG. 2G is a top plan view of the article shown in FIG. 2F. In FIG. 2G, two capacitors 200 are shown as formed from a part of the foil 210. This number is exemplary, however, and any number of capacitors may be formed from a foil according to the embodiments discussed herein. FIG. 2G illustrates two capacitors 200 of similar configuration, however, the present embodiment allows for the formation of capacitors of differing dimensions and/or shape. Other circuitry and/or circuit components having similar or differing configurations can also be formed as part of the same layer as the capacitors 200.

Figure 2H:
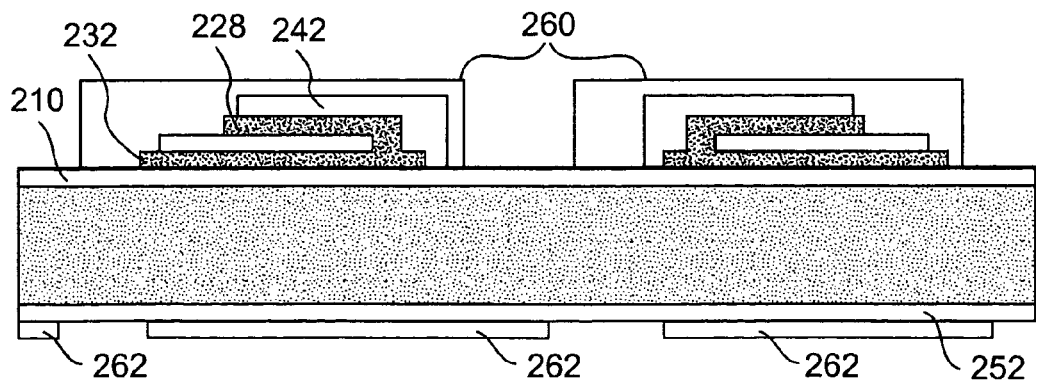

Referring to FIG. 2H, after lamination, a protective coating 260 is applied over the foil 210. In the embodiment illustrated in FIGS. 2A–2K, the protective coating 260 is formed from imaging and developing a photoresist. A photoresist is also applied over the foil 252, imaged, and developed to form the photoresist pattern 262. After imaging and developing the photoresists, the dielectric 228 and the electrodes 232, 242 remain at least partially covered by photoresist 262. It is advantageous to cover all of the dielectric 228 with the photoresist 260, as shown in FIG. 2H, so that the dielectric 228 is not affected by etching chemistries. A portion of the foil 210 may also be covered. The foils 210 and 252 are then etched and the photoresists 260 and 262 are stripped using standard printing wiring board processing conditions.

Figure 2I:
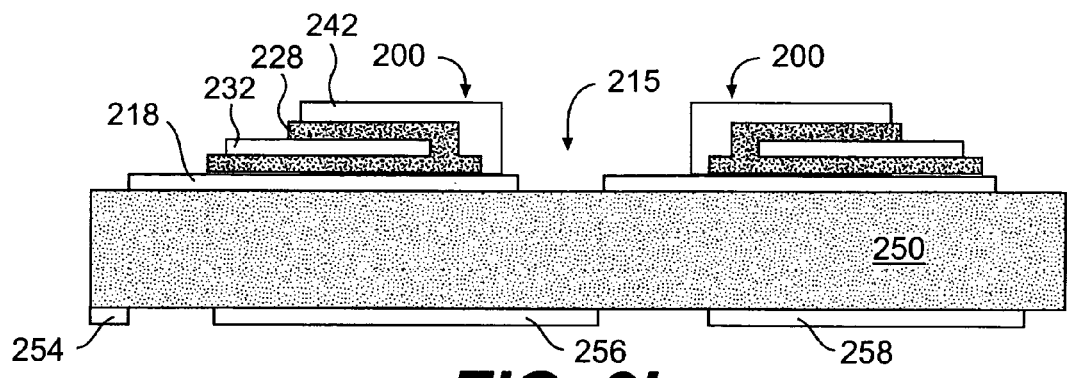

Referring to FIG. 2I, the etching forms a trench 215 in the foil 210, and results in a bottom or capacitor foil electrode 218 that is isolated from the remainder of the foil. The capacitor foil electrode 218, the two-layer dielectric 228, the middle electrode 232, and the top electrode 242 form a capacitor 200. The etching process also creates circuitry 254, 256, 258, etc. from the foil 252. During the etching process, the etching solution does not come in contact with the capacitor dielectric material of the capacitor 200 because the photoresist 260 covers and protects the capacitor structure 200.

Figure 2J:
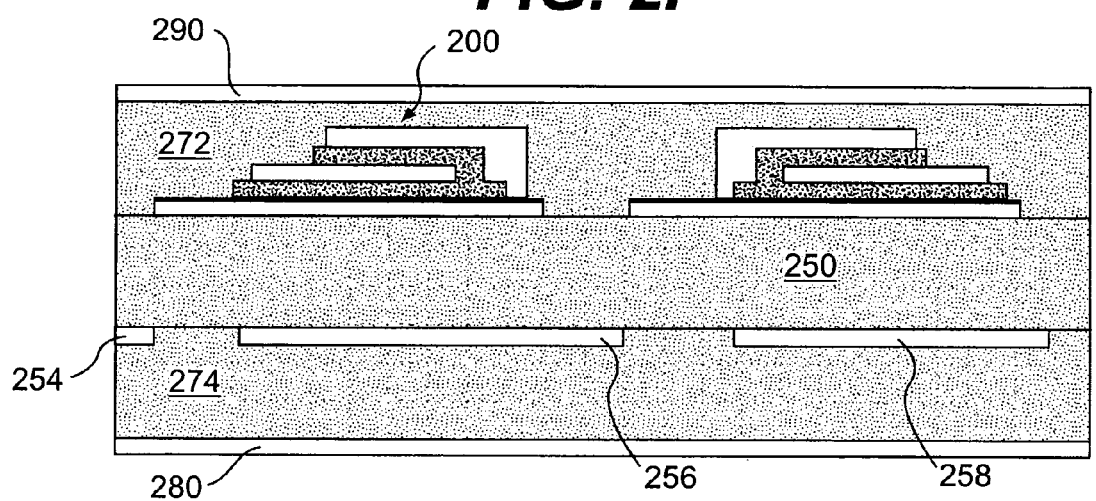

Referring to FIG. 2J, additional laminates 272, 274 and copper foil layer pairs 280, 290 may be laminated to both sides of the innerlayer panel structure of FIG. 2I.

Figure 2K:
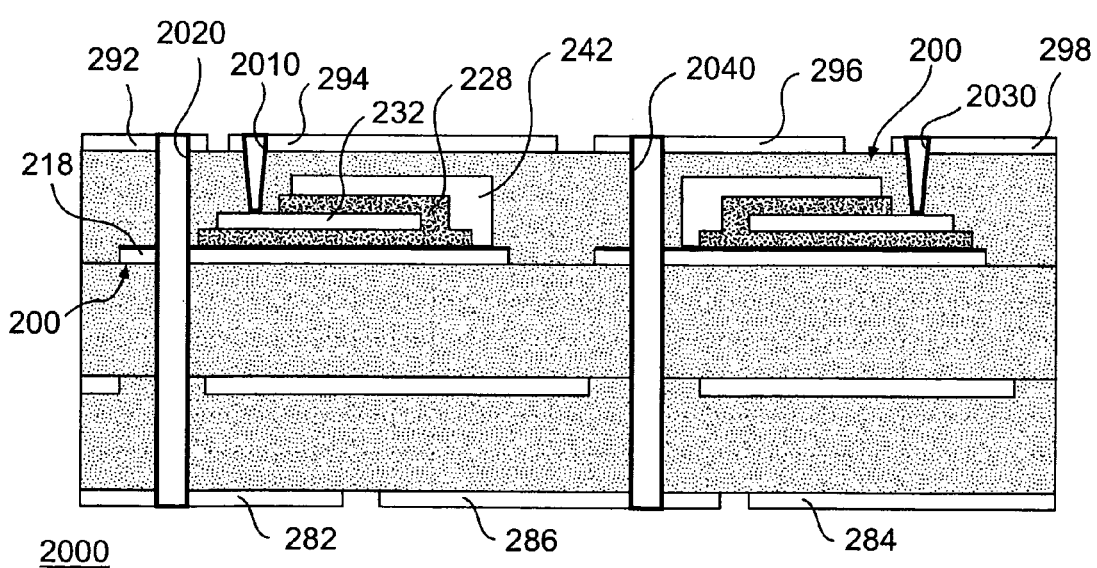

FIG. 2K shows a completed printed circuit board 2000 in front elevation. Referring to FIG. 2K, a photoresist (not shown) is applied to foils 280 and 290. The photoresist is imaged and developed and the foils 290, 280 are etched to form circuitry 282, 284, 286, etc. and 292, 294, 296, 298 etc., respectively. A micro-via 2010 may be laser drilled and plated to connect the electrode 232 with the circuitry 294 on the outer layer of the printed circuit board 2000. A via 2020 may be drilled and plated to connect the bottom or foil electrode 218 to the outer circuitry 282, 292 in order to complete the electrical connections of the capacitor 200. Additional vias 2030, 2040 may also be formed to connect to the other capacitor 200. Top surfaces of the printed circuit board 2000 may be plated with tarnish resistance metals, and finally the photoresist is stripped to complete the module 2000.

The finished printed circuit board 2000 illustrated in FIG. 2K is a four metal layer printed circuit board with the embedded capacitors 200 located in the layer adjacent to the outer layer of the printed circuit board 2000. However, the printed wiring board 2000 may have any number of layers, and embedded capacitors according to the present embodiments can be placed at any layer in a multilayer printed circuit board. Microvias may also be used to connect circuitry with the capacitor foil electrode 218 as an alternative to plated through hole vias.

The two-layer capacitor 200 provides very high capacitance densities. For example, a two-layer capacitor can provide almost double the capacitance density of a single-layer capacitor.

In the above embodiments, the protective coatings are formed from photoresists which are removed during manufacture of the printed circuit boards. A protective coating can also be formed such that it remains in the finished structure.

Figure 3:
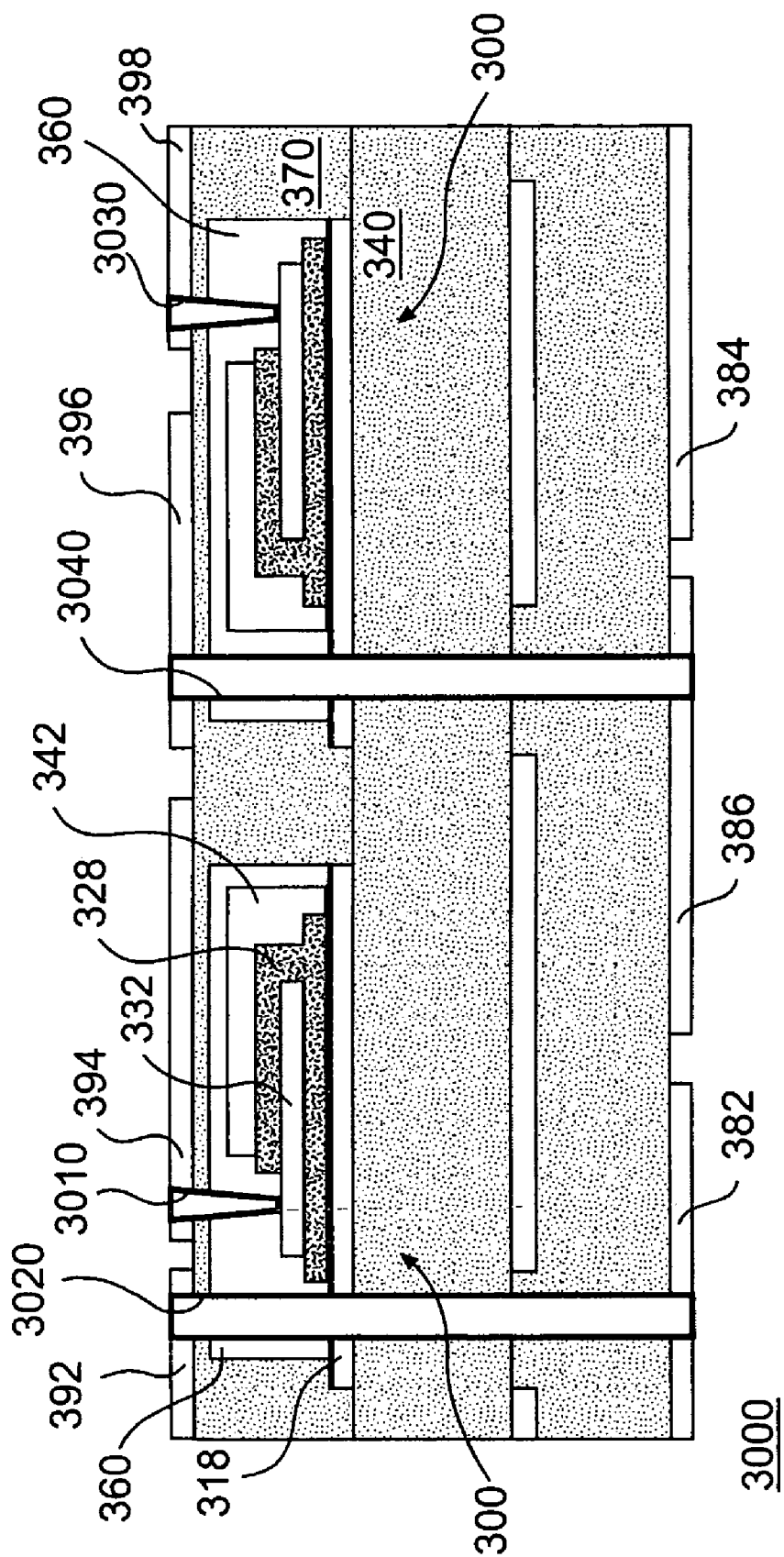
FIG. 3 is a section view in front elevation of a printed circuit board having a protective coating in the finished board.

FIG. 3 is a section view in front elevation of a printed circuit board having a protective coating that becomes part of the finished board.

FIG. 3 shows a completed printed circuit board 3000. Referring to FIG. 3, the printed circuit board 3000 comprises capacitors 300 that were covered by a protective coating 360 before etching. The protective coating 360, however, was not removed and remains a part of the finished board 3000.

The protective coating 360 can be, for example, an organic encapsulant consisting of any suitable polymer-based material that is not attacked by etching chemistries. Such encapsulants may be, for example, epoxy or polyimide resins dissolved in a suitable solvent. The encapsulant may be selectively screen-printed and cured over the layers of the capacitor 300 after the capacitor is fired to form a protective coating.

The protective coating 360 can also be formed from, for example, a glass encapsulant. Glass encapsulants may be printed over selected layers of the capacitor 300 after the capacitor 300 is fired. The glass encapsulant can also be printed and fired along with the capacitor 300.

The printed wiring board 3000 may have a configuration similar to the printed wiring board 2000 shown in FIG. 2K. The printed wiring board 3000 comprises circuitry 382, 384, 386, etc. and 392, 394, 396, 398 etc. on outer surfaces of the printed wiring board 3000. A micro-via 3010 electrically connects an electrode 332 with the outer circuitry 394. A via 3020 electrically connects a bottom or foil electrode 318 to the outer circuitry 382, 392 to complete the electrical connections of the capacitor 300. Additional vias 3030, 3040 electrically connect to the other capacitor 300. Top surfaces of the printed circuit board 3000 may be plated with tarnish resistance metals.

The printed wiring board 3000 may be formed by a method similar to the method described above with reference to FIGS. 2A–2K. However, the protective coating 360 is applied prior to etching, and a separate photoresist (not shown) is developed to perform the etching process. The photoresist is then stripped and the protective coating 360 remains in place.

In the above embodiments, the dielectrics of the capacitors are protected from etching solutions during fabrication. The dielectrics are therefore not subjected to acid etching solutions which would otherwise attack and dissolve the dielectric glasses and dopants in the dielectrics. Capacitor reliability and performance are thereby improved.

The term "coating" as used in this specification is intended to encompass coatings, layers, or encapsulations suitable for protecting layers formed over a foil. A coating may cover all or part of a dielectric, and need not cover an entire capacitor. Covering the entire dielectric is advantageous in that the adverse effects of etching solutions can be minimized or eliminated.

In the above embodiments, the thick-film pastes may comprise finely divided particles of ceramic, glass, metal or other solids. The particles may have a size on the order of 1 micron or less, and may be dispersed in an "organic vehicle" comprising polymers dissolved in a mixture of dispersing agent and organic solvent.

The thick-film dielectric materials may have a high dielectric constant (K) after firing. For example, a high K thick-film dielectric may be formed by mixing a high dielectric constant powder (the "functional phase"), with a glass powder and dispersing the mixture into a thick-film screen-printing vehicle. During firing, the glass component of the capacitor material softens and flows before the peak firing temperature is reached, coalesces, and encapsulates the functional phase forming the fired capacitor composite.

High K functional phases include perovskites of the general formula $ABO_3$, such as crystalline barium titanate (BT), lead zirconate titanate (PZT), lead lanthanum zirconate titanate (PLZT), lead magnesium niobate (PMN) and barium strontium titanate (BST). Barium titanate is advantageous for used in fired on copper foil applications since it is relatively immune to reducing conditions used in firing processes.

Typically, the thick-film glass component of a dielectric material is inert with respect to the high K functional phase and essentially acts to cohesively bond the composite together and to bond the capacitor composite to the substrate. Preferably only small amounts of glass are used so that the dielectric constant of the high K functional phase is not excessively diluted. The glass may be, for example, calcium-aluminum-borosilicates, lead-barium-borosilicates, magnesium-aluminum-silicates, rare earth borates or other similar compositions. Use of a glass with a relatively high dielectric constant is preferred because the dilution effect is less significant and a high dielectric constant of the composite can be maintained. Lead germanate glass of the composition $Pb_5Ge_3O_{11}$ is a ferroelectric glass that has a dielectric constant of approximately 150 and is therefore suitable. Modified versions of lead germanate are also suitable. For example, lead may be partially substituted by barium and the germanium may be partially substituted by silicon, zirconium and/or titanium.

Pastes used to form the electrode layers may be based on metallic powders of copper, nickel, silver, silver-palladium compositions, or mixtures of these compounds. Copper powder compositions are preferred.

The desired sintering temperature is determined by the metallic substrate melting temperature, the electrode melting temperature and the chemical and physical characteristics of the dielectric composition. For example, one set of sintering conditions suitable for use in the above embodiments is a nitrogen firing process having a 10 minute residence time at a peak temperature of 900° C.

The foregoing description of the invention illustrates and describes the present invention. Additionally, the disclosure shows and describes only selected preferred embodiments of the invention, but it is to be understood that the invention is capable of use in various other combinations, modifications, and environments and is capable of changes or modifications within the scope of the inventive concept as expressed herein, commensurate with the above teachings, and/or within the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments, not explicitly defined in the detailed description.

What is claimed is:

1. A method of making a printed circuit board having outer circuitry, comprising:
   providing a metallic foil;
   forming a dielectric over the metallic foil;
   forming a first electrode over the dielectric;
   laminating a non-component side of the metallic foil to at least one dielectric material;
   forming a protective coating over at least a part of the dielectric;
   etching the metallic foil to form a second electrode, wherein the first electrode,
   the dielectric and the second electrode form a capacitor;
   forming one or more vias,
   wherein the vias connect either the first electrode or the second electrode directly to the outer circuitry, and
   laminating a component side of the metallic foil to at least one additional dielectric material.

2. The method of claim 1, wherein the entire dielectric is covered by the protective coating.

3. The method of claim 2, wherein the second electrode is at least partially covered by the protective coating.

4. The method of claim 1, wherein the dielectric is a two-layer dielectric, the method comprising:
   forming a third electrode over the two-layer dielectric, wherein the third electrode is electrically coupled to the second electrode.

5. The method of claim 1, further comprising laminating a component side of the metallic foil to at least one additional dielectric material.

6. The method of claim 5, wherein laminating to at least one additional dielectric material comprises:
   laminating said additional dielectric material to a component side of the metallic foil after etching the metallic foil.

7. The method of claim 5, wherein the at least one additional dielectric material is laminated over the protective coating.

8. The method of claim 1, wherein the protective coating is a photoresist, the method comprising:
   removing the photoresist after etching the metallic foil.

9. The method of claim 1, wherein forming a protective coating comprises:
   forming an organic encapsulant material over the dielectric; and
   curing the organic encapsulant material.

10. The method of claim 1, wherein forming a protective coating comprises:
    forming a layer comprising glass over the dielectric; and
    firing the glass layer.

* * * * *